United States Patent
Krishnan (10) Patent No.: US 7,999,625 B2
(45) Date of Patent: Aug. 16, 2011

(54) METHOD AND APPARATUS FOR CALIBRATING OSCILLATORS

(75) Inventor: Koushik Krishnan, Santa Clara, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 46 days.

(21) Appl. No.: 12/562,399

(22) Filed: Sep. 18, 2009

(65) Prior Publication Data
US 2011/0068874 A1 Mar. 24, 2011

(51) Int. Cl.
G01R 23/00 (2006.01)
H03L 7/06 (2006.01)
H03L 7/10 (2006.01)
H03L 7/18 (2006.01)

(52) U.S. Cl. .............. 331/44; 331/14; 331/16
(58) Field of Classification Search ............ 331/14, 331/16–18, 25, 44
See application file for complete search history.

(56) References Cited

U.S. PATENT DOCUMENTS
4,746,879 A * 5/1988 Ma et al. ............ 331/44
2006/0258312 A1 11/2006 Uozumi et al.

FOREIGN PATENT DOCUMENTS
EP 1460762 A1 9/2004

OTHER PUBLICATIONS
International Search Report and Written Opinion—PCT/US2010/049274, International Search Authority—European Patent Office—Dec. 2, 2010.

* cited by examiner

*Primary Examiner* — David Mis
(74) *Attorney, Agent, or Firm* — Kenneth K. Vu; William M. Hooks (57) ABSTRACT

A method of calibrating oscillators is disclosed that includes searching, in an array storing an operational characteristic of the oscillator, for an index value that is associated with an output of the oscillator; determining that the output is within a predetermined accuracy as compared to a desired output; and generating the output based the index value. An apparatus for performing the method is also disclosed herein.

29 Claims, 12 Drawing Sheets

Index Table 800

| Clock Frequency Value Range | Clock Frequency Unit Code Step ($F_{STEP}$) |
|---|---|
| 3.5GHz to 4.5GHz | 30MHz |
| 4.5GHz to 6GHz | 32MHz |
| 6.0GHz to 7.5GHz | 34MHz |
| 7.5GHz to 8.25GHz | 36MHz |

| Iteration Number | Binary Search Frequency Value | Informed Search Frequency Value |
|---|---|---|
| 1 | 4.25GHz | 4.25GHz |
| 2 | 5.00GHz | 4.90GHz |
| 3 | 4.58GHz | 4.82GHz* |
| 4 | 4.87GHz | 4.82GHz |
| 5 | 4.82GHz | 4.82GHz |
| 6 | 4.80GHz | 4.82GHz |
| 7 | 4.82GHz* | 4.82GHz |

METHOD AND APPARATUS FOR CALIBRATING OSCILLATORS

BACKGROUND

I. Field

The following description relates generally to communication systems, and more particularly, to a method and apparatus for calibrating oscillators.

II. Background

In the integrated radio transceivers of many communication systems, voltage controlled oscillators (VCO) are used to generate the clock signals that are necessary for proper operation. For example, the signal from a VCO may be used to generate the radio frequency (RF) frequencies for use in frequency synthesizers. In the field of wireless communications, where a large number of channels are crowded in narrow high frequency ranges and frequency synthesizers are widely used to generate stable frequencies for transceivers, either as the transmitting frequencies or the local oscillator frequencies to beat with the receiving signals, even small variations in the operation of the VCO can cause problems.

The performance of the communication system, consequently, is critically dependent on the purity of the synthesized high-frequency output signals. For example, during signal reception, if the frequency source is impure, the result will be a mixing of undesired channels into the desired channel signal. During signal transmission, an impure frequency source will create interference in neighboring channels. Thus, it must follow that the frequency synthesizer and the underlying clock source must be carefully designed. However, even if these design concerns are addressed, variations in manufacturing processes and temperature fluctuations during operation can cause deviations in the center frequency of the VCO when it is free-running.

In view of the various unknowns and the required accuracy during normal operation, a calibration process for the VCO needs to occur at initialization of the communication system, and the clock generation system in general, is required. The wireless communication system needs to perform clock calibration so the other systems can operate. However, the time spent for calibration of the clock generation system is at a premium in wireless systems. Typically, the calibration or search is implemented using a binary search approach. This approach is the most generic of sorted search methods and does not assume prior knowledge of the system. The algorithm converges to the desired solution in a fixed number of steps, the number being proportional to the resolution desired. For example, the more accurate the refinement, the more steps will be required. However, the binary search only uses the direction of the error to get closer to the desired value.

Consequently, it would be desirable to address one or more of the deficiencies described above.

SUMMARY

According to various aspects, the subject innovation relates to systems and/or methods for calibrating an oscillator.

According to another aspect of the disclosure, a method of wireless communication is provided. The method includes searching, in an array storing an operational characteristic of the oscillator, for an index value that is associated with an output of the oscillator; determining that the output is within a predetermined accuracy as compared to a desired output; and generating the output based the index value.

According to yet another aspect of the disclosure, an apparatus for wireless communication is provided. The apparatus includes means for searching, in an array storing an operational characteristic of the oscillator, for an index value that is associated with an output of the oscillator; determining that the output is within a predetermined accuracy as compared to a desired output; and generating the output based the index value.

According to yet another aspect of the disclosure, an apparatus for wireless communication is provided. The apparatus includes a memory storing an array comprising an operational characteristic of the oscillator; and, a processing system configured to search, in the array, for an index value that is associated with an output of the oscillator; determine that the output is within a predetermined accuracy as compared to a desired output; and generating the output based the index value.

According to yet another aspect of the disclosure, a computer-program product for communication is disclosed. The computer-program product includes a machine-readable medium encoded with instructions executable by a processor to cause the processor to search, in an array storing an operational characteristic of the oscillator, for an index value that is associated with an output of the oscillator; determine that the output is within a predetermined accuracy as compared to a desired output; and generate the output based the index value.

According to yet another aspect of the disclosure, a communications device with an oscillator is disclosed. The communications device includes a wireless network adapter configured to receive a transmission for a packet using a timing signal based on the oscillator. The communications device further includes a processing system configured to: search, in an array storing an operational characteristic of the oscillator, for an index value that is associated with an output of the oscillator; determine that the output is within a predetermined accuracy as compared to a desired output; and generate the output based the index value.

Although particular aspects are described herein, many variations and permutations of these aspects fall within the scope of the disclosure. Whereas some benefits and advantages of the preferred aspects are mentioned, the scope of the disclosure is not intended to be limited to particular benefits, uses, or objectives. Rather, aspects of the disclosure are intended to be broadly applicable to different wireless and wire line technologies, system configurations, networks, and transmission protocols, some of which are illustrated by way of example in the figures and in the following Detailed Description. The detailed description and drawings are merely illustrative of the disclosure rather than limiting, the scope of the disclosure being defined by the appended claims and equivalents thereof.

BRIEF DESCRIPTION OF THE DRAWINGS

These and other sample aspects of the disclosure will be described in the detailed description that follow, and in the accompanying drawings, wherein.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The oscillator calibration approach described herein reduces complexity of a calibration operation to achieve a required calibration of an oscillator. Referred to as an informed search calibration, in one aspect, the approach reduces the time complexity of the search by expanding the path close to the desired search value. In general, the efficiency of the approach depends on how similar the heuristic data is to the array where the search is intended. The approach is most suited for calibrating open-loop quasi-linear systems like voltage controlled oscillators (VCOs) or analog filters.

Figure 1:
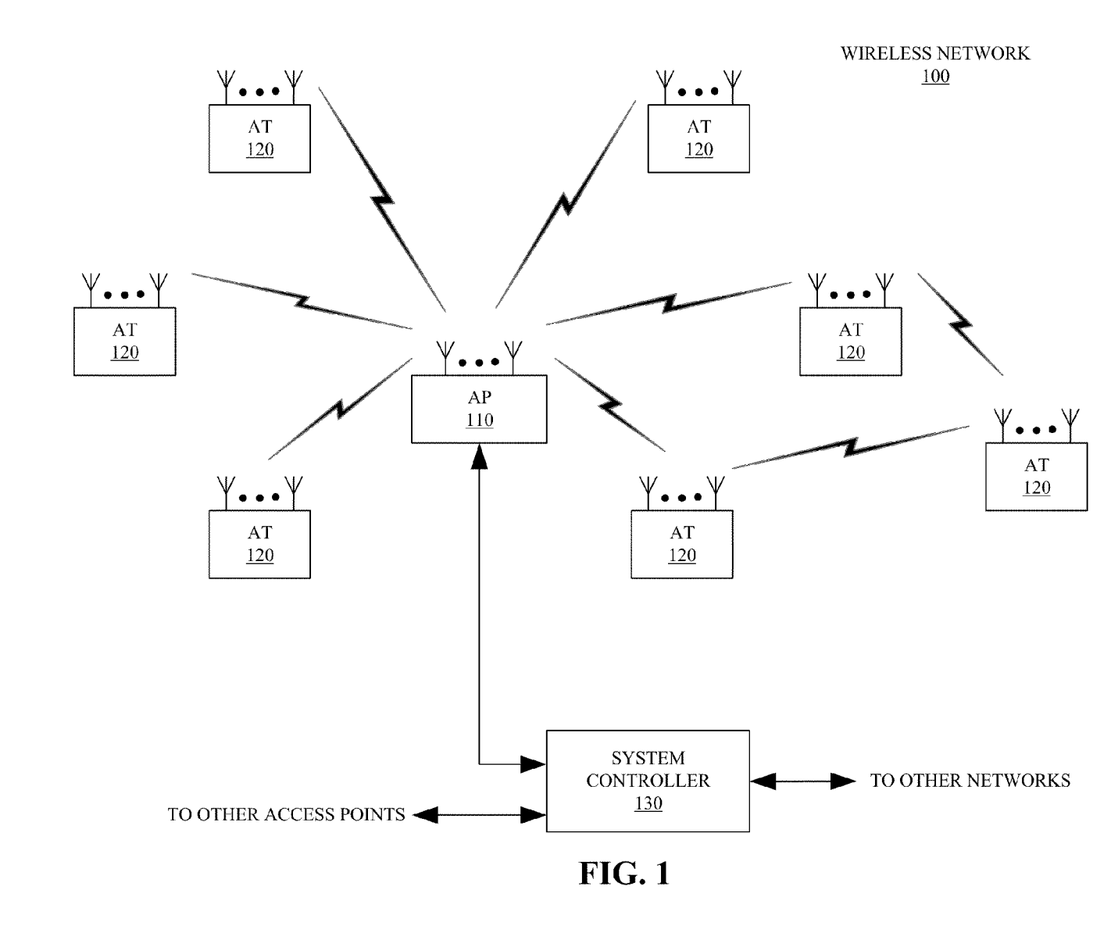
FIG. 1 is a diagram of a wireless communications network configured in accordance with an aspect of the disclosure.

Several aspects of a wireless network 100 that includes devices that uses the oscillator calibration system will now be presented with reference to FIG. 1. The wireless network 100 is shown with several wireless nodes, generally designated as nodes 110 and 120. Each wireless node is capable of receiving and/or transmitting and includes radio systems that include frequency synthesizers using VCOs. In the detailed description that follows, the term "access point" is used to designate a transmitting node and the term "access terminal" is used to designate a receiving node for downlink communications, whereas the term "access point" is used to designate a receiving node and the term "access terminal" is used to designate a transmitting node for uplink communications. However, those skilled in the art will readily understand that other terminology or nomenclature may be used for an access point and/or access terminal. By way of example, an access point may be referred to as a base station, a base transceiver station, a station, a terminal, a node, an access terminal acting as an access point, or some other suitable terminology. An access terminal may be referred to as a user terminal, a mobile station, a subscriber station, a station, a wireless device, a terminal, a node, or some other suitable terminology. The various concepts described throughout this disclosure are intended to apply to all suitable wireless nodes regardless of their specific nomenclature.

The wireless network 100 may support any number of access points distributed throughout a geographic region to provide coverage for access terminals 120. A system controller 130 may be used to provide coordination and control of the access points, as well as access to other networks (e.g., Internet) for the access terminals 120. For simplicity, one access point 110 is shown. An access point is generally a fixed terminal that provides backhaul services to access terminals in the geographic region of coverage. However, the access point may be mobile in some applications. An access terminal, which may be fixed or mobile, utilizes the backhaul services of an access point or engages in peer-to-peer communications with other access terminals. Examples of access terminals include a telephone (e.g., cellular telephone), a laptop computer, a desktop computer, a Personal Digital Assistant (PDA), a digital audio player (e.g., MP3 player), a camera, a game console, or any other suitable wireless node.

The wireless network 100 may support MIMO technology. Using MIMO technology, an access point 110 may communicate with multiple access terminals 120 simultaneously using SDMA. SDMA is a multiple access scheme which enables multiple streams transmitted to different receivers at the same time to share the same frequency channel and, as a result, provide higher user capacity. This is achieved by spatially precoding each data stream and then transmitting each spatially precoded stream through a different transmit antenna on the downlink. The spatially precoded data streams arrive at the access terminals with different spatial signatures, which enables each access terminal 120 to recover the data stream destined for that access terminal 120. On the uplink, each access terminal 120 transmits a spatially precoded data stream, which enables the access point 110 to identify the source of each spatially precoded data stream.

The wireless node, whether an access point or access terminal, may be implemented with a protocol that utilizes a layered structure that includes a physical (PHY) layer that implements all the physical and electrical specifications to interface the wireless node to the shared wireless channel, a MAC layer that coordinates access to the shared wireless channel, and an application layer that performs various data processing functions including, by way of example, speech and multimedia codecs and graphics processing. Additional protocol layers (e.g., network layer, transport layer) may be required for any particular application. In some configurations, the wireless node may act as a relay point between an access point and access terminal, or two access terminals, and therefore, may not require an application layer. Those skilled in the art will be readily able to implement the appropriate protocol for any wireless node depending on the particular application and the overall design constraints imposed on the overall system.

Figure 2:
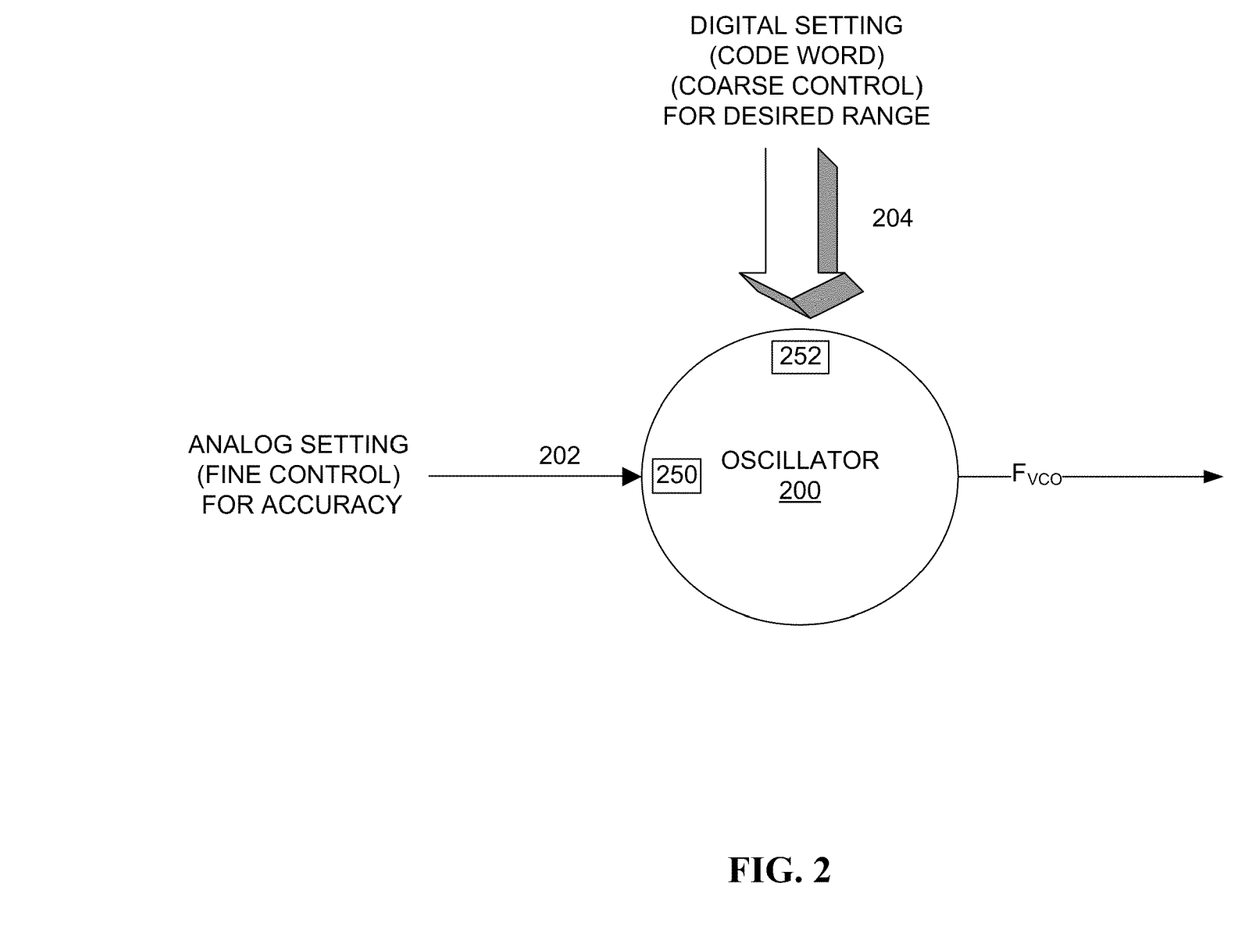
FIG. 2 is a block diagram of an oscillator component configured in accordance with an aspect of the disclosure used in a clock generation system in a wireless node in the wireless communications network of FIG. 1.

FIG. 2 illustrates an oscillator 200 with its controlling variables. In an aspect of the disclosure, the oscillator 200 has an analog input 250 for fine frequency control, and a digital input 252 for coarse frequency control. The setting on the coarse input adjusts the coarse frequency range of the operation of the oscillator 200. Fine setting aids in "locking" the synthesizer to the incoming frequency. For the oscillator 200 to lock to the desired frequency, it is important that the coarse setting is at the correct setting.

Figure 3:
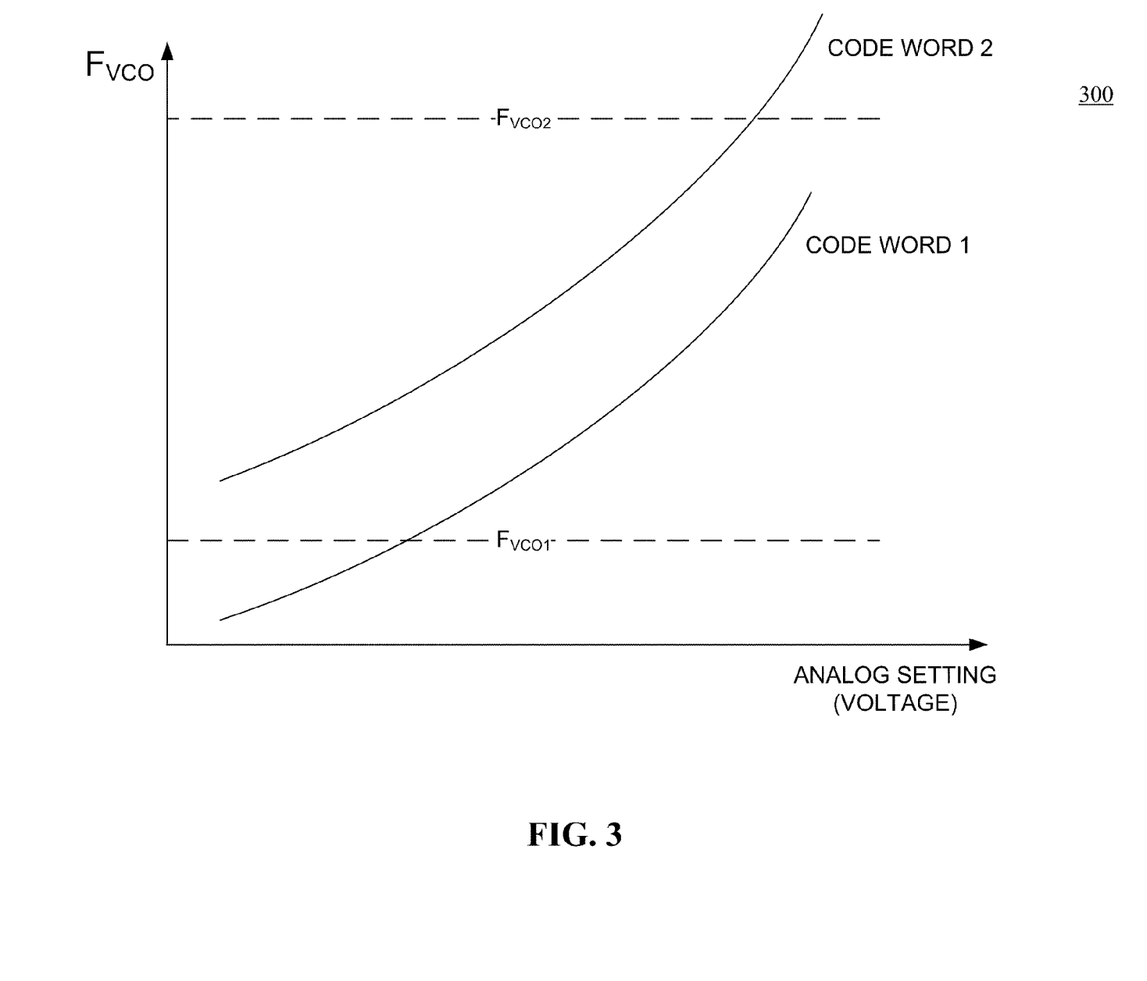
FIG. 3 is a plot illustrating the frequency response of the oscillator of FIG. 2 for a given code word and a corresponding range of analog settings of the in accordance with an aspect of the disclosure.

For example, as illustrated by a frequency response plot 300 in FIG. 3, the oscillator 200 can only be brought within range of and lock to frequency $F_{VCO1}$ using a 'CODE WORD 1' setting, while the oscillator 200 can only be brought within range of and lock to frequency $F_{VCO2}$ using a 'CODE WORD 2' setting. There are two modes of operation for the oscillator 200. The first mode of operation for the oscillator 200 is a calibration mode, during which the calibration unit 200 is used to bring the operating frequency of the oscillator 200 to the desired range by adjusting the digital setting 204. The analog setting 202 is set to a known fixed analog voltage. During the second, or otherwise referred to as normal, mode of operation, the previously adjusted digital setting 204 is held to the state previously set during calibration and the analog setting 202 of the VCO 200 is used to acquire a 'lock' to the incoming signal. In an aspect, the analog setting 202 and the digital setting 204 relate to voltage values. In another aspect, where these settings can relate to current values.

Figure 4:
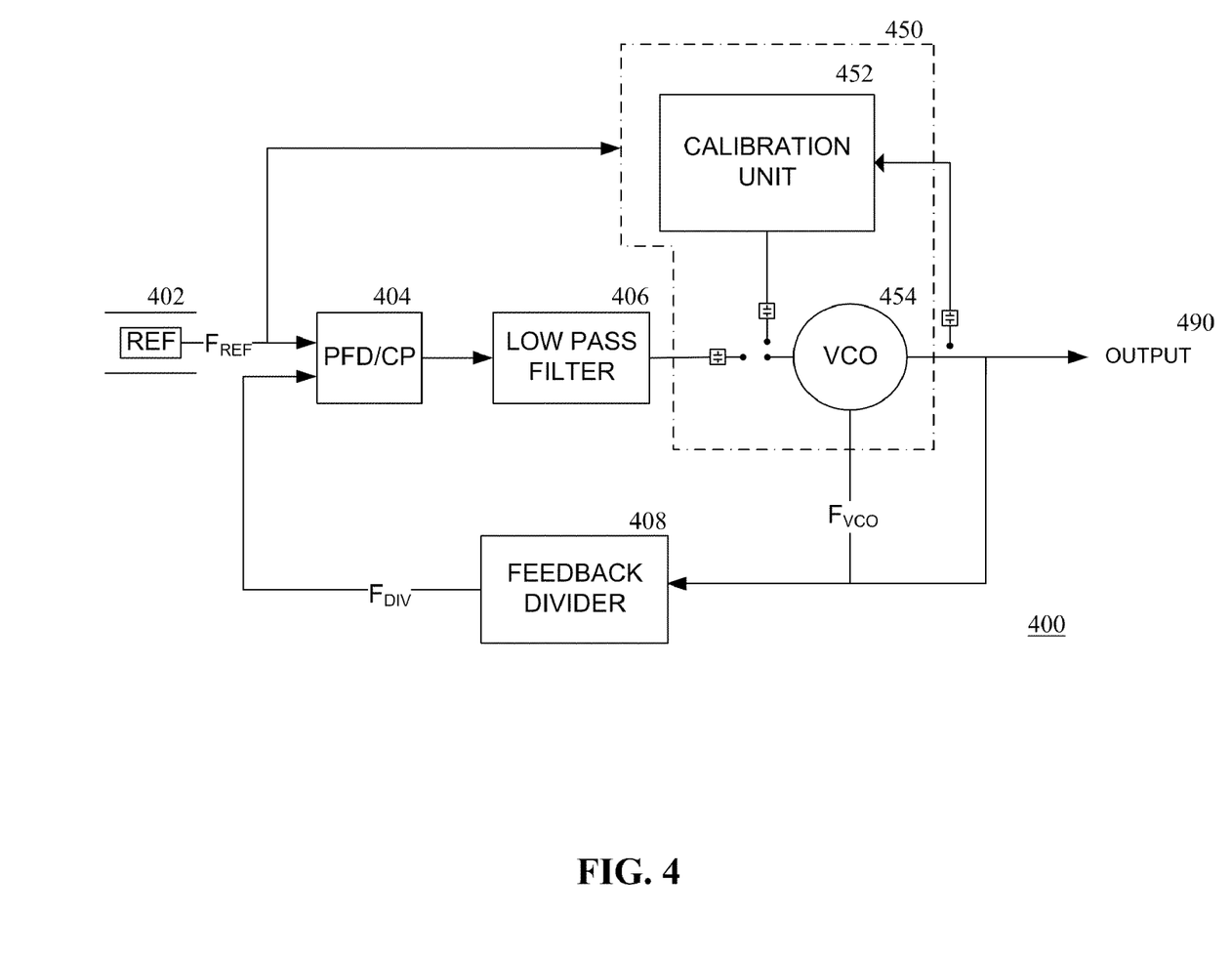
FIG. 4 is a block diagram of a clock generation system configured in accordance with an aspect of the disclosure used in a wireless node in the wireless communications network of FIG. 1.

FIG. 4 illustrates a block diagram of a clock generation system 400. In one aspect, the clock generation system 400 is a phase locked loop (PLL) that includes a reference (REF) clock 402, a phase frequency detector/charge pump (PFD/CP) 404, a low pass filter 406, a feedback divider 408 and a self-calibrating VCO circuit 450. The self-calibrating VCO circuit 450 includes a VCO 454 with a calibration unit 452. The VCO 454 outputs a signal 490 with a particular frequency $F_{VCO}$. During normal operation, the VCO 454 is connected to the low pass filter 406 and disconnected from the calibration unit 452 so that the VCO 454 "locks" onto the incoming frequency. During calibration mode, the path between the low pass filter 406 and the VCO 454 is disconnected, and the calibration unit 452 is connected to the VCO 454 to bring the operating frequency of the VCO 454 within a proximity of the desired frequency ($F_{VCO}$).

The PFD/CP 404 generates an output signal that is a function of the difference between the phases and/or frequency of two input signals. As illustrated, one of the signals is a reference frequency $F_{REF}$ derived from REF clock 402, which generates a fixed stable frequency. The other signal, $F_{DIV}$, is from the calibrated VCO circuit 454 after it has been divided by a feedback divider 408. The output of the PFD/CP 404 is filtered by the low-pass filter 406 and the direct current (DC) component of the difference of the two signals is applied to the self-calibrating VCO circuit 450. In one aspect, the signal fed back to the feedback divider 408 from the self-calibrating VCO circuit 450 is divided by a predetermined factor M.

The output from the calibration unit 452 programs the VCO 454 to change frequency in the direction that reduces the difference between the VCO free running frequency and the desired $F_{VCO}$. During the calibration process, the VCO 454 is disconnected from the low pass filter 406. If the two frequencies are sufficiently close—for example, within a tolerable level of accuracy—the VCO 454 is considered to be "in proximity" to the desired frequency $F_{VCO}$. The corresponding state of the calibration unit 252 is saved so that VCO 454 generates the desired frequency during normal operation. The PLL feedback mechanism attempts to adjust the output of the VCO 454 so that the two-frequency/phase detector input signals will be closely matched. In one aspect, the output of the calibration unit 452 is a digital code and a known, fixed analog voltage/current. The digital code is a sequence of bits that program the VCO 454 to output a signal at a predetermined level. Thus, the number of different signal levels of output $F_{VCO}$, otherwise referred to as the resolution and the range of the system, is directly related to the number of bits in the digital code.

Figure 5:
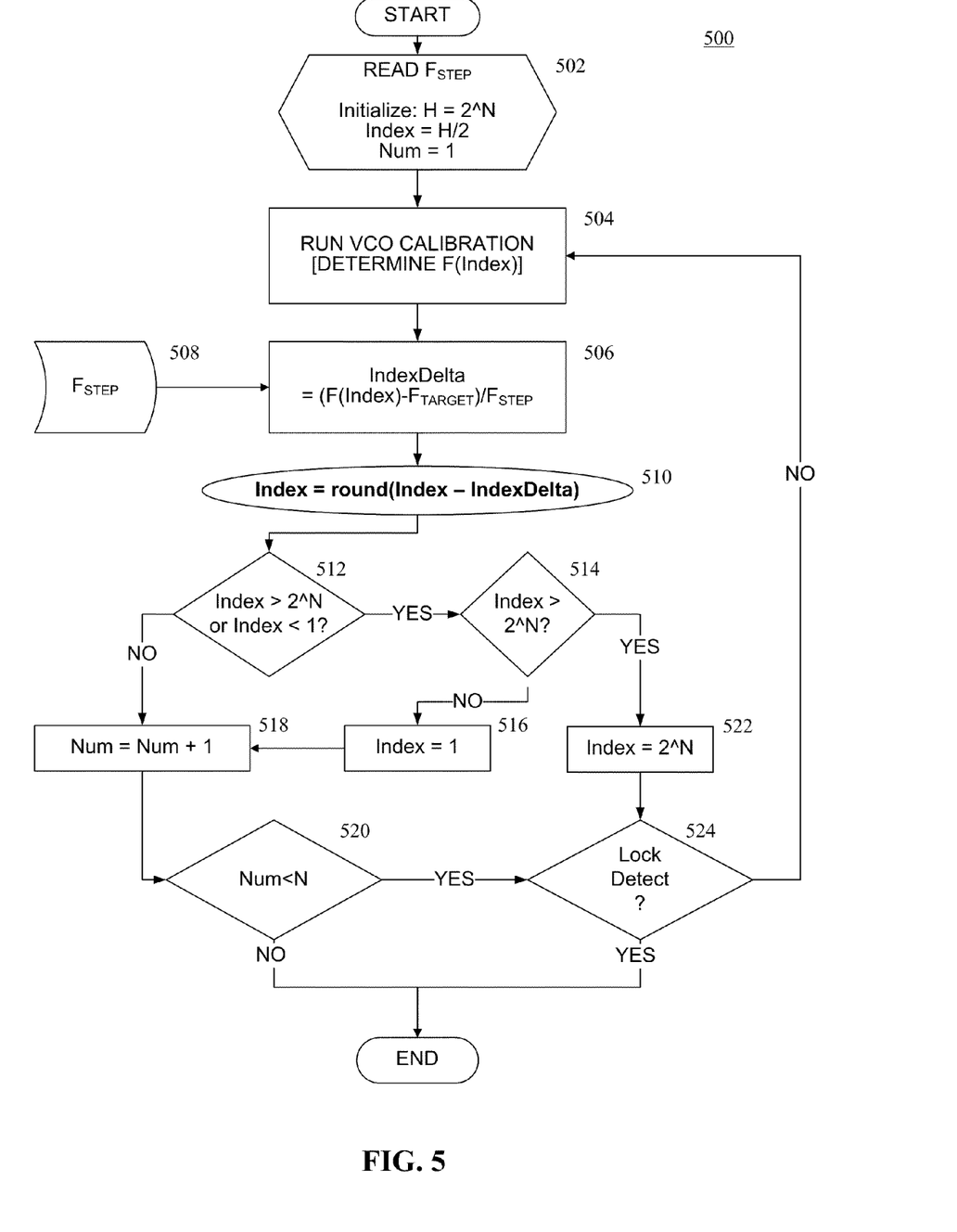
FIG. 5 is a flow diagram of an oscillator calibration process configured in accordance with an aspect of the disclosure that may be used with the clock generation system of FIG. 4.

FIG. 5 illustrates an oscillator calibration process 500 as an example of the informed search calibration approach in one aspect of the disclosure where, in step 502, the clock generation system 400 is initialized with default values, including loading $F_{STEP}$ into a database 508. In one aspect, the values of $F_{STEP}$ are based on the operating characteristics of the VCO. A calculation is also performed of the number of signal levels, H, that the VCO 454 can be controlled to output is performed during the initialization process. As discussed previously, the number of signal levels is based on the size of the code word, which in this case is represented by N, and is the resolution of the clock generation system 400. A variable Index is arbitrarily set to be at the half of the code word range.

In step 504, the frequency of the VCO 454 is determined. In one aspect, the frequency of the VCO 454 is determined by comparing the frequency of the output of the VCO 454 against a fixed number of cycles from the REF clock 402.

In step 506, how distant the current code word is from the desired code word is determined by the following formula:

$$IndexDelta = \frac{F(Index) - F_{TARGET}}{F_{STEP}}$$

where IndexDelta is the adjusted difference between: (1) the frequency of the signal that would be generated by the VCO 454 based on the value of the Index variable; and (2) the target frequency $F_{TARGET}$. In an aspect, the adjustment is achieved by dividing the difference of (1) and (2) with $F_{STEP}$.

In step 510, the Index variable is adjusted by the amount calculated for IndexDelta, and rounded to achieve a whole number.

In step 512, it is determined if the Index variable is within, but not equal to, the bounds of the maximum and minimum allowed values of 2^N and 1, exclusive, respectively. If not, then operation continues with step 514. Otherwise, operation continues with step 518.

In step 514, it is determined if the value of the Index variable is larger than 2^N, if so, then operation continues with step 522. Otherwise, operation continues with step 516.

In step 522, if it has been determined that the value of the Index variable is larger than 2^N, then the value of the Index variable is set to 2^N. Operation then continues with step 524.

In step 516, if it has been determined that the value of the Index variable is not larger than 2^N, then the value of the Index variable must be smaller than 1 because it has already been determined that the value of the Index variable had to be either larger than 2^N or smaller than 1 in step 512 previously. Operation then continues with step 518.

Returning to step 512, if it is determined that the value of the Index variable is within the bounds of the maximum and minimum allowed values of 2^N and 1, exclusive, then operation continues with step 518.

In step 518, where the Num variable is incremented before its incremented value is checked in step 520.

In step 520, it is determined if the value of the Num variable is less than N. The purpose of this step is to ensure the loop is not run beyond N iterations. If the value in the Num variable has not reached the limit N, then operation continues with step 524. Otherwise, the execution of the process 500 terminates.

In step 524, it is determined if a lock on the desired frequency has been reached. If so, then the process 500 terminates as calibration has been reached. Otherwise, operation continues with step 504, where calibration of the VCO 454 occurs again and the rest of the process repeats as described herein.

Figure 6:
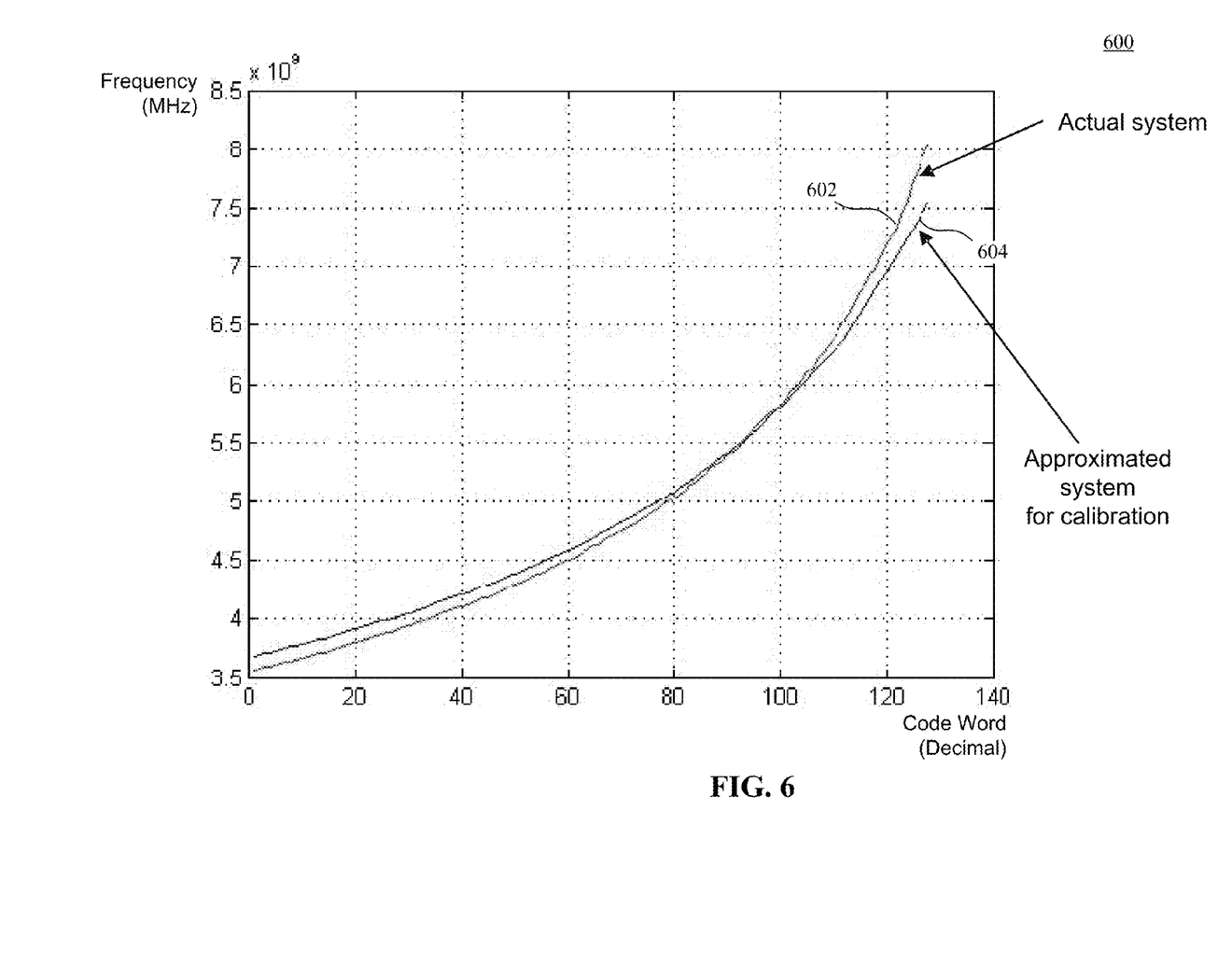
FIG. 6 is a plot with a comparison of the operational characteristics of the clock generation system of FIG. 4 and an approximated version thereof in accordance with an aspect of the disclosure.

FIG. 6 illustrates a plot 600 of the actual operational characteristics curve 602 of the clock generation system of FIG. 4 and an approximated operational characteristics curve 604 that is an approximated version more suitable for use in the calibration process 500 for the clock generation system 400. Thus, because there is an estimated model of the operating characteristics of the real system, an informed search can be performed using the approximated operational characteristics curve 604 as a guide. The parameters related to the approximated operational characteristics curve 604 generated for the particular VCO may be stored in the clock generation system.

Figure 7:
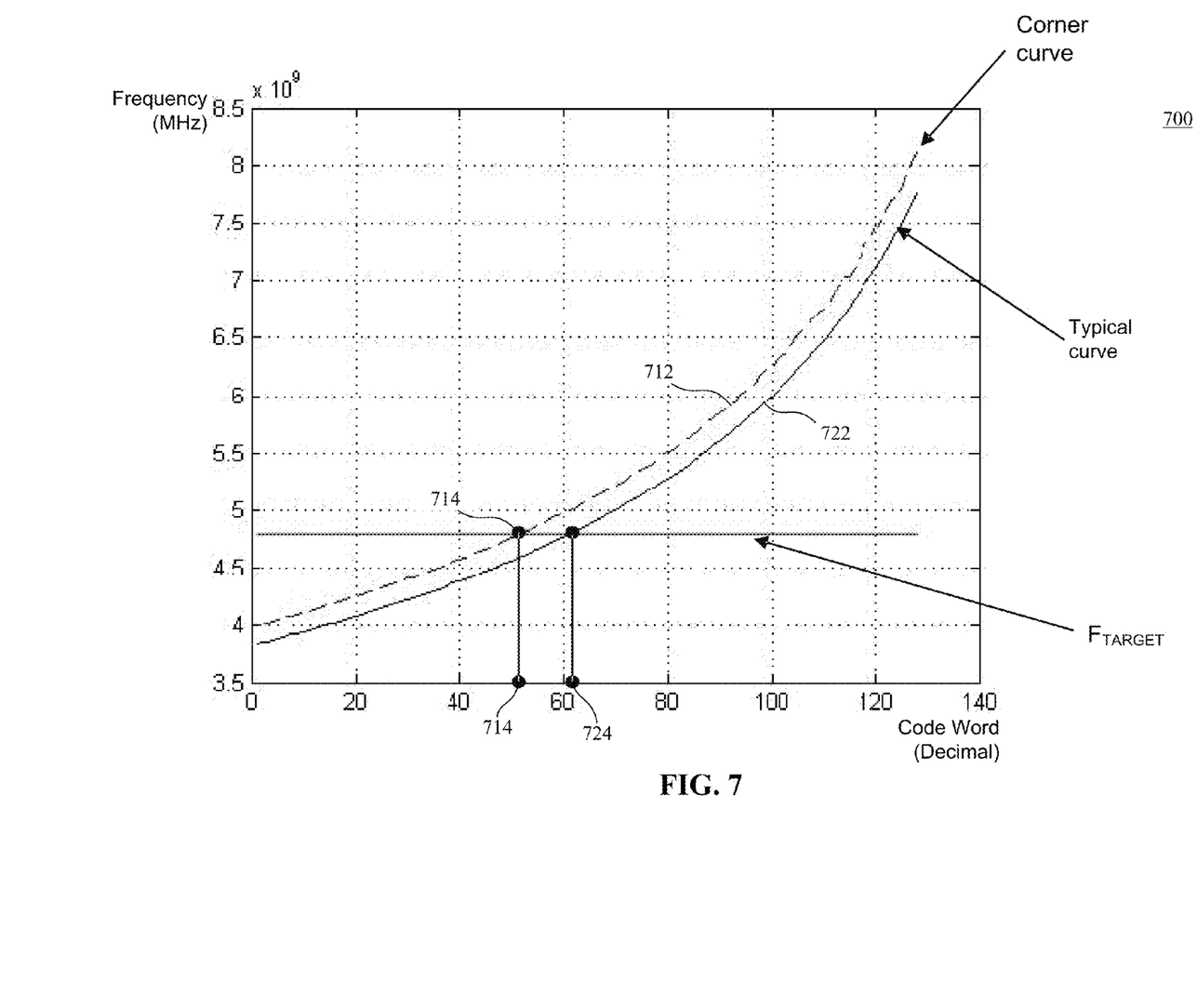
FIG. 7 is a plot of the operational characteristics of the clock generation system of FIG. 4 as a system for search.

FIG. 7 illustrates a plot 700 of the operational characteristics of the clock generation system of FIG. 4 as a system for search, with a typical operation characteristics curve 722 representing the typical operational characteristics of a VCO such as that may be used in the clock generation system 400 that has not been adjusted. A corner curve 712 illustrates the operational characteristics of the VCO as adjusted by the oscillator calibration process 500. Operating the VCO with the typical operation characteristics curve 722 to reach $F_{TARGET}$ would require a code word 724 that would be different than operating the VCO with a code word 714 associated with the calibrated corner curve 712.

Figure 8:
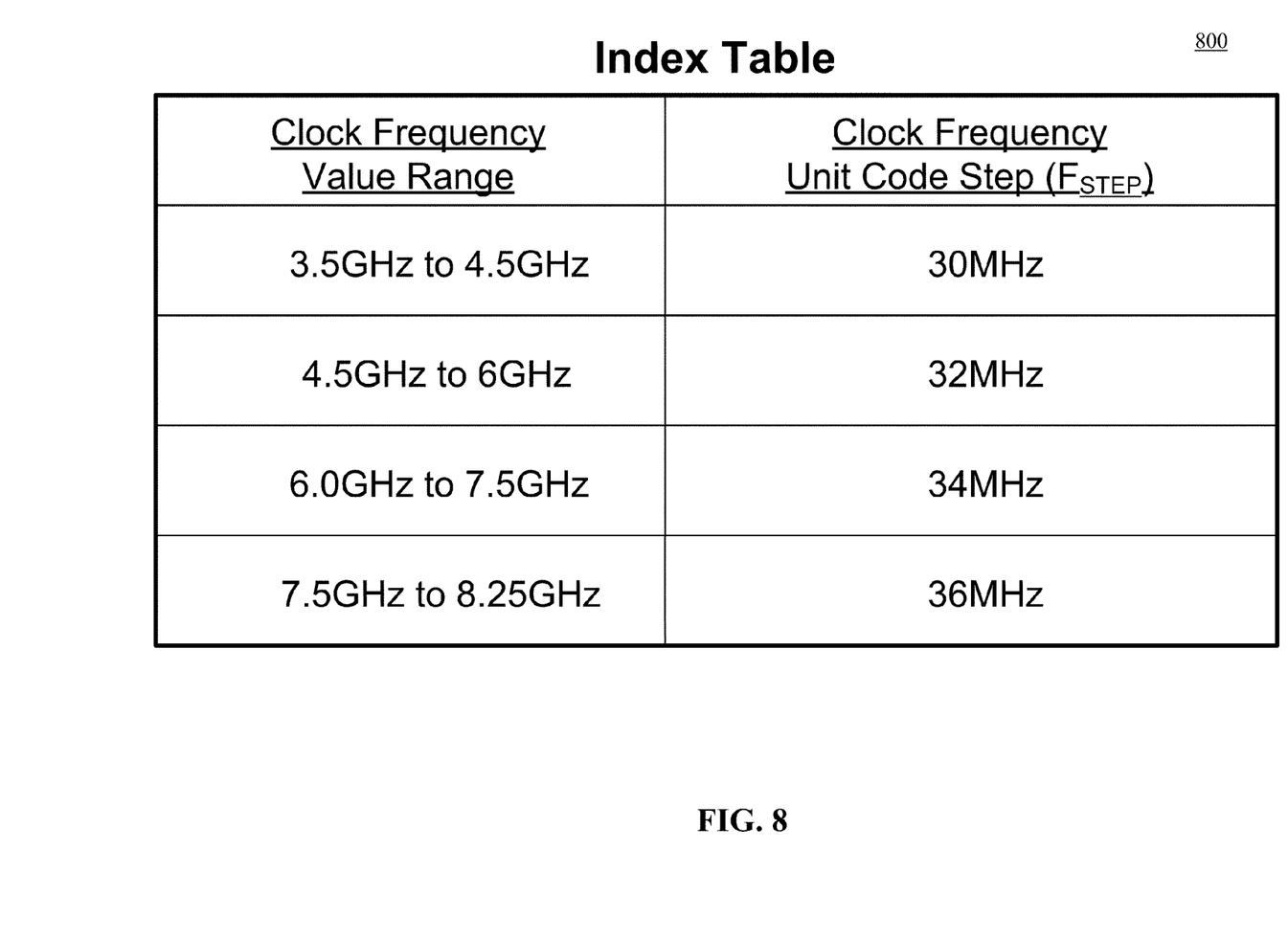
FIG. 8 is a table with possible index values configured in accordance with an aspect of the disclosure that may be used with the clock generation system of FIG. 4.

The following is an example of a calculation of IndexDelta using the values contained in FIG. 8:

$F_{TARGET}$=4.8 GHz
$F_{CURRENT}$=F(Index)=6.25 GHz

*IndexDelta*

$= (6.25 \text{ GHz} - 6.0 \text{ GHz})/34 \text{ MHz} + (6.0 \text{ GHz} - 4.8 \text{ GHz})/32 \text{ MHz}$ $= 250/34 + 1200/32$ $= 7 + 37$ $= 44 \text{(code decrement)}$ where IndexDelta is calculated based on the locations of F(Index) and $F_{TARGET}$. The step size is changed depending on the clock frequency code value. In the above example, a step size, $F_{STEP}$, of 34 MHz is used for the frequency range of 6.25 GHz to 6.0 GHz, and an $F_{STEP}$ of 32.0 MHz is used for the frequency range of 6.0 GHz to 4.8 GHz. $F_{INDEX}$=(x,y)=coordinate of curve. $F_{STEP}$ indicates the magnitude of a characteristic of the frequency slope (i.e., a rate of change) at (x,y) in the predetermined direction at the particular $F_{INDEX}$. In essence, each range of the operational characteristics of the oscillator system listed in the first column is associated with a slope for that particular range, as listed in the second column. Hence, the sharper the slope, the smaller the step size (or size of code word changes) needs to be to achieve a similar adjustment.

Figure 9:
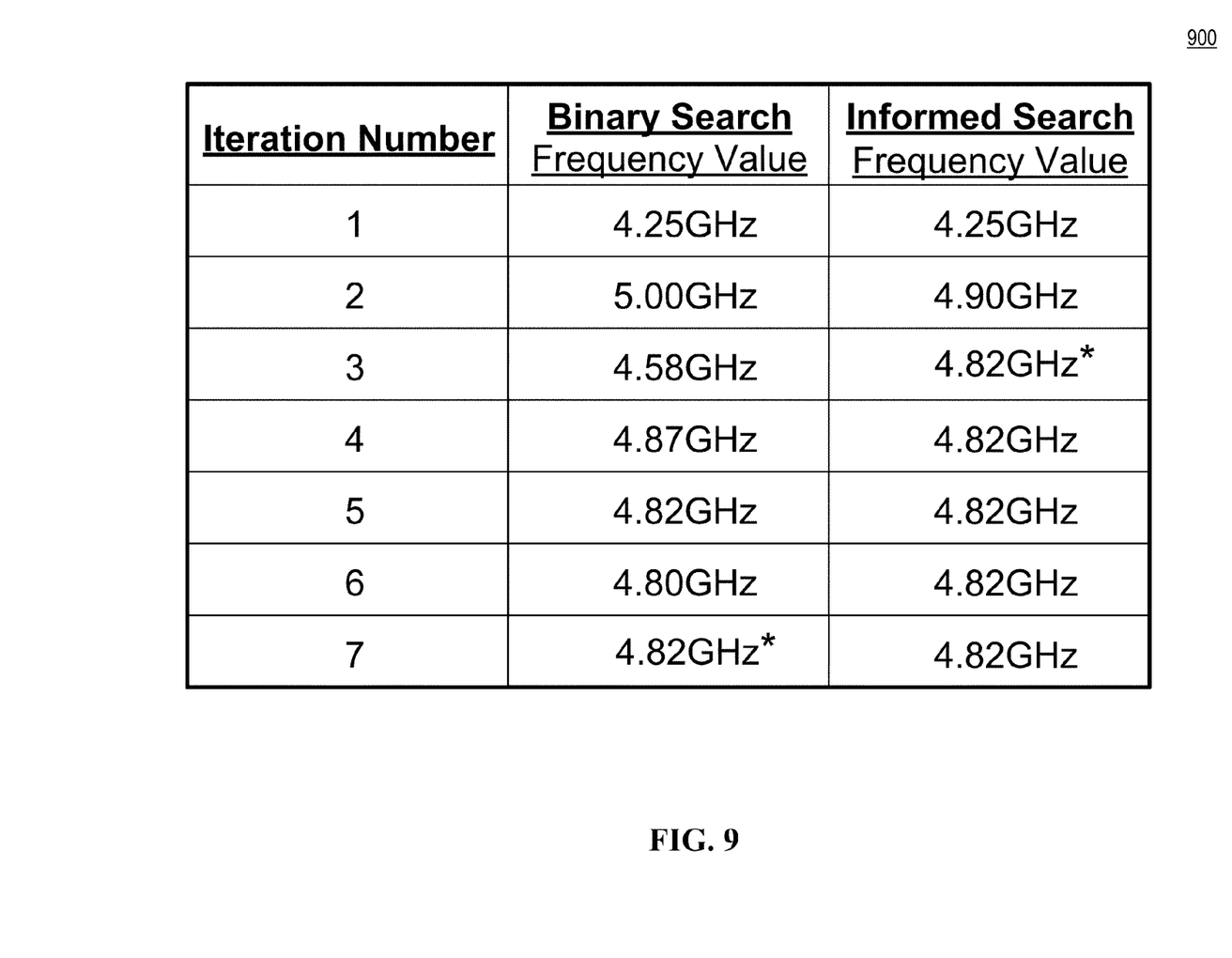
FIG. 9 is a table listing the results of an example operation of the oscillator calibration process of FIG. 5 as compared to the binary search.
Figure 10:
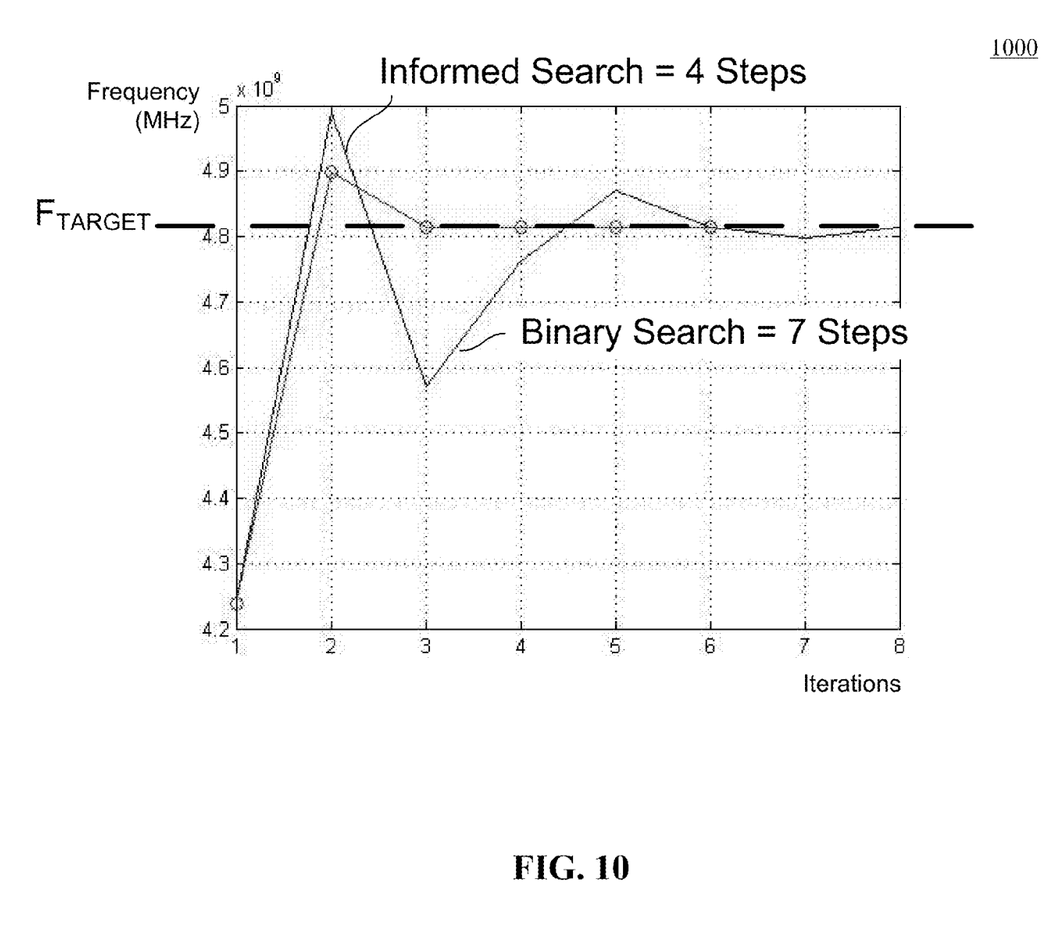
FIG. 10 is a plot with a comparison of operation of the binary search and the oscillator calibration process of FIG. 5.

FIGS. 9 and 10 illustrate a comparison of operation of the binary search and the informed search approach in the oscillator calibration process 500 in both table and plot forms, respectively. As illustrated, the informed search approach reaches and confirms a result in 4 iterations [Thereby a table 900 in FIG. 9 and a plot 1000 in FIG. 10, the informed search reaches the right closest correct value in 3 iterations. Is, with a the $4^{th}$ iteration being used as a confirmation to confirm?], while the binary search approach results requires 7 iterations to reach the result in 7 iterations.

The informed search approach has general applications for quasi-linear systems and can be used to improve dramatically the search time from that achieved in a linear search approach. For example, the binary search approach only uses the direction of the error difference between the current frequency and the desired frequency to be moved closer to the desired value. In contrast, the efficiency of the informed search approach depends on how similar the heuristic data is to the array where the search is intended. The efficiency of the informed search approach thus depends on how similar the heuristic data is to the area where search is intended.

The informed search approach can find its way into a wide variety of applications, including online system calibration, to post silicon test and characterization. For example, the informed search approach may be used during the calibration of systems where the test time is critical, such as the reduction of access terminal equipment test time. In another example, the informed search approach can be used for fast frequency hopping systems, where the channel switch time is very small, such as spread spectrum clocking or ultra-wide band (UWB) applications. In yet another example, the informed search approach as described herein may be used for the fast calibration of a frequency synthesizer, where the startup time of the synthesizer should be at a minimum.

Figure 11:
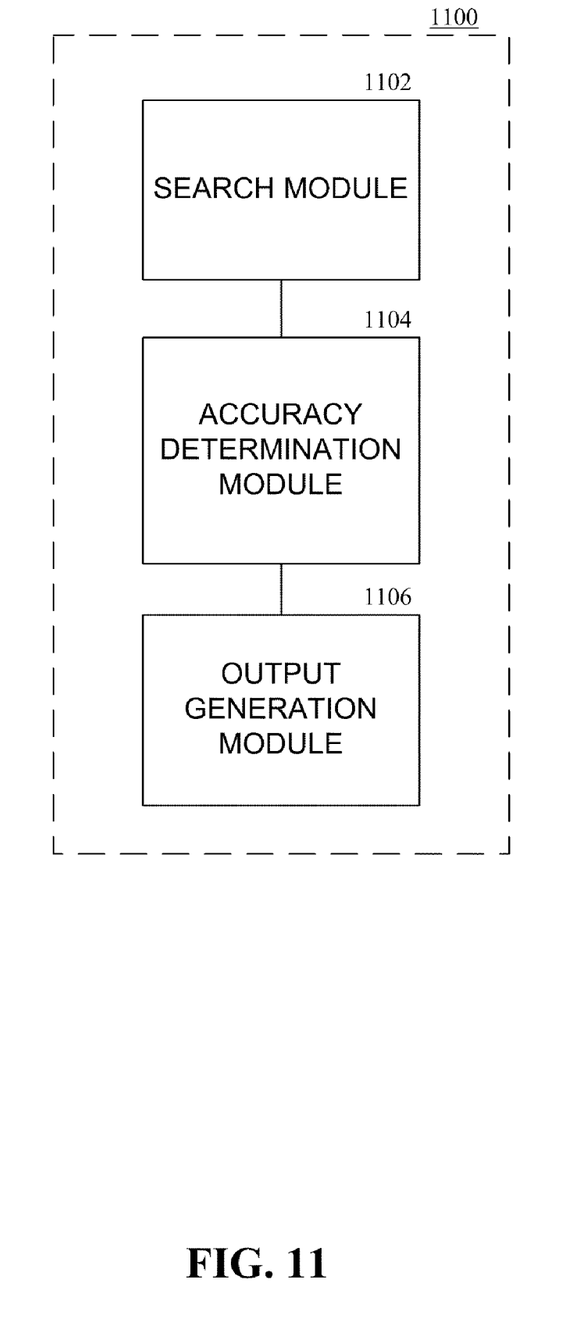
FIG. 11 is a block diagram of a communication apparatus configured in accordance with an aspect of the disclosure.

FIG. 11 is a block diagram illustrating an example of the functionality of an apparatus for calibrating an oscillator 1100 according to another aspect of the disclosure. The apparatus for communication 1100 includes a search module 1102 for searching, in an array storing an operational characteristic of the oscillator, for an index value that is associated with an output of the oscillator; an accuracy determination module 1104 for determining that the output is within a predetermined accuracy as compared to a desired output; and an output generation module 1106 for generating the output based the index value.

Figure 12:
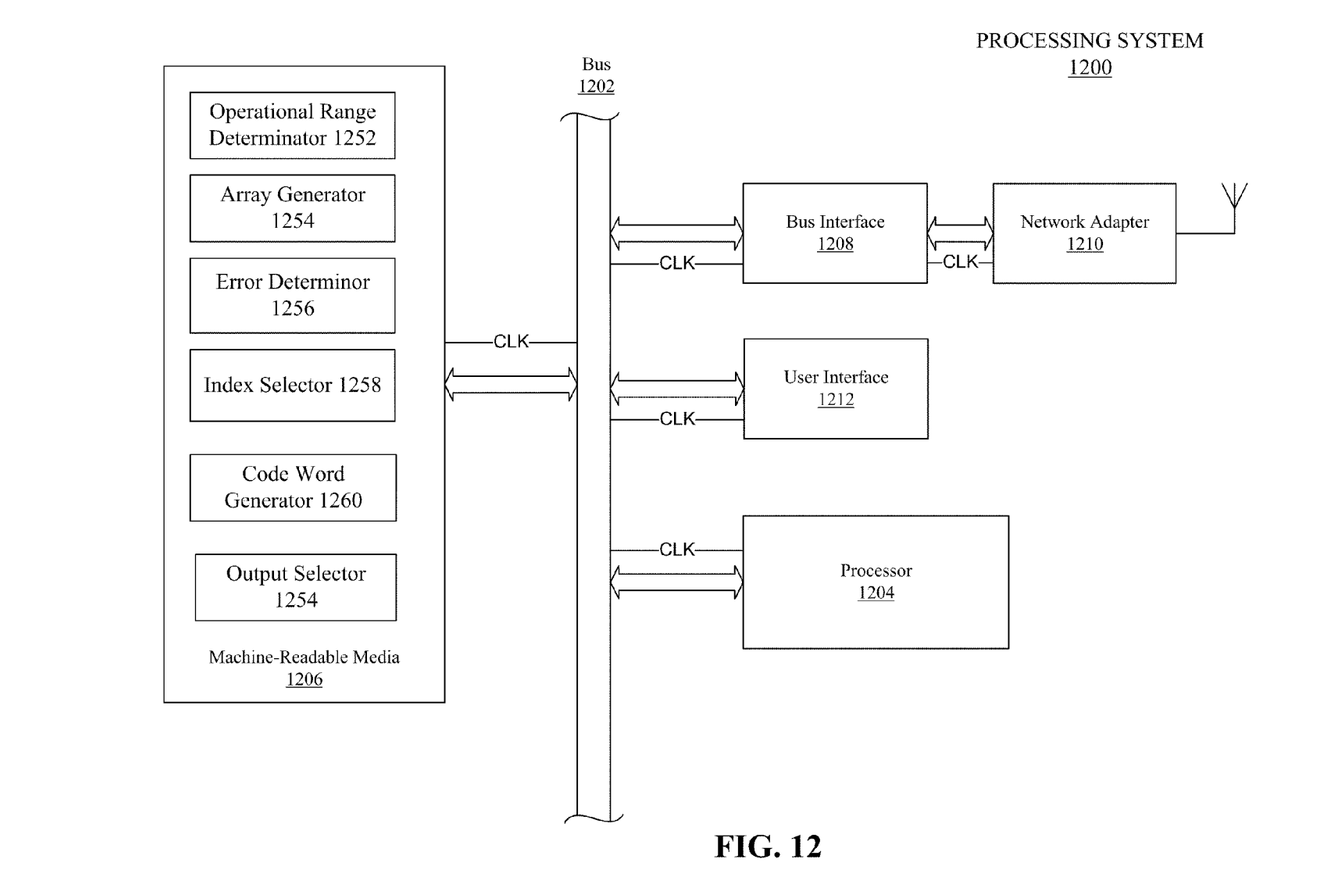
FIG. 12 is a block diagram illustrating an example of a hardware configuration for a processing system in a wireless node in the wireless communications network of FIG. 1.

FIG. 12 is a conceptual diagram illustrating an example of a hardware configuration for a processing system in a wireless node. In this example, the processing system 1200 may be implemented with a bus architecture represented generally by bus 1202. The bus 1202 may include any number of interconnecting buses and bridges depending on the specific application of the processing system 1200 and the overall design constraints. The bus links together various circuits including a processor 1204, machine-readable media 1206, and a bus interface 1208. The bus interface 1208 may be used to connect a network adapter 1210, among other things, to the processing system 1200 via the bus 1202. The network interface 1210 may be used to implement the signal processing functions of the PHY layer. In the case of an access terminal 110 (see FIG. 1), a user interface 1212 (e.g., keypad, display, mouse, joystick, etc.) may also be connected to the bus. The bus 1202 includes a clock line (CLK) to communicate a clock.

The bus 1202 may also link various other circuits such as timing sources, peripherals, voltage regulators, power management circuits, and the like, which are well known in the art, and therefore, will not be described any further.

The processor 1204 is responsible for managing the bus and general processing, including the execution of software stored on the machine-readable media 1208. The processor 1208 may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable may be embodied in a computer-program product. The computer-program product may comprise packaging materials.

In the hardware implementation illustrated in FIG. 1211, the machine-readable media 1206 is shown as part of the processing system 1200 separate from the processor 1204. However, as those skilled in the art will readily appreciate, the machine-readable media 1206, or any portion thereof, may be external to the processing system 1200. By way of example, the machine-readable media 1206 may include a transmission line, a carrier wave modulated by data, and/or a computer product separate from the wireless node, all which may be accessed by the processor 1204 through the bus interface 1208. Alternatively, or in addition to, the machine readable media 1204, or any portion thereof, may be integrated into the processor 1204, such as the case may be with cache and/or general register files. The machine-readable media 1206 includes a plurality of modules that includes an operational range determinor 1252, which determines the operational characteristic of the oscillator over a plurality of ranges of a criteria, and an array generator 1254, which generates an array over the plurality of ranges of the criteria. The array generator 1254 can also create a table including a plurality of magnitude of characteristic change, each associated with a corresponding range of the oscillator.

The machine-readable media 1206 also includes an error determinator 1256 including a magnitude and a direction between the output of the oscillator and the desired output value; and an index value selector (1258), based on the determined error, in the vicinity of the desired value. The machine-readable media 1206 further includes a code word generator 1260 based on the index value; and an output selector 1262 of the oscillator using the codeword.

The processing system 1200 may be configured as a general-purpose processing system with one or more microprocessors providing the processor functionality and external memory providing at least a portion of the machine-readable media 1206, all linked together with other supporting circuitry through an external bus architecture. Alternatively, the processing system 1200 may be implemented with an ASIC (Application Specific Integrated Circuit) with the processor 1204, the bus interface 1208, the user interface 1212 in the case of an access terminal), supporting circuitry (not shown), and at least a portion of the machine-readable media 1206 integrated into a single chip, or with one or more FPGAs (Field Programmable Gate Array), PLDs (Programmable Logic Device), controllers, state machines, gated logic, discrete hardware components, or any other suitable circuitry, or any combination of circuits that can perform the various functionality described throughout this disclosure. Those skilled in the art will recognize how best to implement the described functionality for the processing system 1200 depending on the particular application and the overall design constraints imposed on the overall system.

The machine-readable media 1206 is shown with a number of software modules. The software modules include instructions that when executed by the processor 1204 cause the processing system 1200 to perform various functions. Each software module may reside in a single storage device or distributed across multiple storage devices. By way of example, a software module may be loaded into RAM from a hard drive when a triggering event occurs. During execution of the software module, the processor 1204 may load some of the instructions into cache to increase access speed. One or more cache lines may then be loaded into a general register file for execution by the processor 1204. When referring to the functionality of a software module below, it will be understood that such functionality is implemented by the processor 1204 when executing instructions from that software module.

Various aspects described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media may include, but are not limited to, magnetic storage devices, optical disks, digital versatile disk, smart cards, and flash memory devices.

The disclosure is not intended to be limited to the preferred aspects. Furthermore, those skilled in the art should recognize that the method and apparatus aspects described herein may be implemented in a variety of ways, including implementations in hardware, software, firmware, or various combinations thereof. Examples of such hardware may include ASICs, Field Programmable Gate Arrays, general-purpose processors, DSPs, and/or other circuitry. Software and/or firmware implementations of the disclosure may be implemented via any combination of programming languages, including Java, C, C++, Matlab™, Verilog, VHDL, and/or processor specific machine and assembly languages.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The method and system aspects described herein merely illustrate particular aspects of the disclosure. It should be appreciated that those skilled in the art will be able to devise various arrangements, which, although not explicitly described or shown herein, embody the principles of the disclosure and are included within its scope. Furthermore, all examples and conditional language recited herein are intended to be only for pedagogical purposes to aid the reader in understanding the principles of the disclosure. This disclosure and its associated references are to be construed as being without limitation to such specifically recited examples and conditions. Moreover, all statements herein reciting principles, aspects, and aspects of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry, algorithms, and functional steps embodying principles of the disclosure. Similarly, it should be appreciated that any flow charts, flow diagrams, signal diagrams, system diagrams, codes, and the like represent various processes that may be substantially represented in computer-readable medium and so executed by a computer or processor, whether or not such computer or processor is explicitly shown.

It is understood that any specific order or hierarchy of steps described in the context of a software module is being presented to provide an examples of a wireless node. Based upon design preferences, it is understood that the specific order or hierarchy of steps may be rearranged while remaining within the scope of the disclosure.

Although various aspects of the disclosure have been described as software implementations, those skilled in the art will readily appreciate that the various software modules presented throughout this disclosure may be implemented in hardware, or any combination of software and hardware. Whether these aspects are implemented in hardware or software depends upon the particular application and design constraints imposed on the overall system. Skilled artisans may implement the described functionality in varying ways for each particular application, but such implementation decisions should not be interpreted as causing a departure from the scope of the disclosure.

The previous description is provided to enable any person skilled in the art to understand fully the full scope of the disclosure. Modifications to the various configurations disclosed herein will be readily apparent to those skilled in the art. Thus, the claims are not intended to be limited to the various aspects of the disclosure described herein, but is to be accorded the full scope consistent with the language of claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for calibrating an oscillator comprising:
   searching, in an array storing an operational characteristic of the oscillator, for an index value that is associated with an output of the oscillator;
   determining that the output is within a predetermined accuracy as compared to a desired output; and
   generating the output based the index value.

2. The method of claim 1, wherein the operational characteristic of the oscillator comprises at least one of a frequency and a phase characteristic.

3. The method of claim 1, wherein the operational characteristic of the oscillator comprises a rate of change value for an operational range of the characteristic.

4. The method of claim 1, wherein the output is at least one of a frequency and a phase value.

5. The method of claim 1, further comprising:
   determining the operational characteristic of the oscillator over a plurality of ranges of a criteria; and,
   generating the array based on the plurality of ranges of the criteria.

6. The method of claim 5, wherein the generation comprises creating a table comprising of a plurality of magnitude of characteristic change, each associated with a corresponding range.

7. The method of claim 1, wherein the search comprises:
   determining an error comprising a magnitude and a direction between the output and the desired output value; and
   selecting the index value, based on the determined error, in the vicinity of the desired value.

8. The method of claim 1, wherein the output generation comprises:
   generating a code word based on the index value; and
   setting the output of the oscillator using the codeword.

9. The method of claim 1, wherein the output comprises a frequency and the desired output comprises a desired frequency, and the accuracy determination comprises comparing the frequency of the output with the reference frequency of the desired output.

10. An apparatus for calibrating an oscillator comprising:
    means for searching, in an array storing an operational characteristic of the oscillator, for an index value that is associated with an output of the oscillator;
    means for determining that the output is within a predetermined accuracy as compared to a desired output; and
    means for generating the output based the index value.

11. The apparatus of claim 10, wherein the operational characteristic of the oscillator comprises at least one of a frequency and a phase characteristic.

12. The apparatus of claim 10, wherein the operational characteristic of the oscillator comprises a rate of change value for an operational range of the characteristic.

13. The apparatus of claim 10, wherein the output is at least one of a frequency and a phase value.

14. The apparatus of claim 10, further comprising:
means for determining the operational characteristic of the oscillator over a plurality of ranges of a criteria; and,
means for generating the array based on the plurality of ranges of the criteria.

15. The apparatus of claim 14, wherein the generation means comprises means for creating a table comprising of a plurality of magnitude of characteristic change, each associated with a corresponding range.

16. The apparatus of claim 10, wherein the search means comprises:
means for determining an error comprising a magnitude and a direction between the output and the desired output value; and
means for selecting the index value, based on the determined error, in the vicinity of the desired value.

17. The apparatus of claim 10, wherein the output generation means comprises:
means for generating a code word based on the index value; and
means for setting the output of the oscillator using the codeword.

18. The apparatus of claim 10, wherein the output comprises a frequency and the desired output comprises a desired frequency, and the accuracy determination means comprises means for comparing the frequency of the output with the reference frequency of the desired output.

19. An apparatus for calibrating an oscillator, comprising:
a memory storing an array comprising an operational characteristic of the oscillator; and,
a processing system configured to:
search, in the array, for an index value that is associated with an output of the oscillator;
determine that the output is within a predetermined accuracy as compared to a desired output; and
generating the output based the index value.

20. The apparatus of claim 19, wherein the operational characteristic of the oscillator comprises at least one of a frequency and a phase characteristic.

21. The apparatus of claim 19, wherein the operational characteristic of the oscillator comprises a rate of change value for an operational range of the characteristic.

22. The apparatus of claim 19, wherein the output is at least one of a frequency and a phase value.

23. The apparatus of claim 19, wherein the processing system is further configured to:
determine the operational characteristic of the oscillator over a plurality of ranges of a criteria; and,
generate the array based on the plurality of ranges of the criteria.

24. The apparatus of claim 23, wherein the generation comprises creating a table comprising of a plurality of magnitude of characteristic change, each associated with a corresponding range.

25. The apparatus of claim 19, wherein the search comprises:
determining an error comprising a magnitude and a direction between the output and the desired output value; and
selecting the index value, based on the determined error, in the vicinity of the desired value.

26. The apparatus of claim 19, wherein the output generation comprises:
generating a code word based on the index value; and
setting the output of the oscillator using the codeword.

27. The apparatus of claim 19, wherein the output comprises a frequency and the desired output comprises a desired frequency, and the accuracy determination comprises comparing the frequency of the output with the reference frequency of the desired output.

28. A computer-program product for calibrating an oscillator, comprising:
a machine-readable medium encoded with instructions executable by a processor to cause the processor to:
search, in an array storing an operational characteristic of the oscillator, for an index value that is associated with an output of the oscillator;
determine that the output is within a predetermined accuracy as compared to a desired output; and
generate the output based the index value.

29. A communications device with an oscillator, comprising:
a wireless network adapter configured to receive a transmission for a packet using a timing signal based on the oscillator; and
a processing system configured to:
search, in an array storing an operational characteristic of the oscillator, for an index value that is associated with an output of the oscillator;
determine that the output is within a predetermined accuracy as compared to a desired output; and
generate the output based the index value.

* * * * *